United States Patent
Ajima (10) Patent No.: US 10,148,251 B2
(45) Date of Patent: Dec. 4, 2018

(54) ELASTIC WAVE APPARATUS

(71) Applicant: Murata Manufacturing Co., Ltd., Nagaokakyo-shi, Kyoto-fu (JP)

(72) Inventor: Daisuke Ajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 63 days.

(21) Appl. No.: 15/604,740

(22) Filed: May 25, 2017

(65) Prior Publication Data

US 2017/0373670 A1 Dec. 28, 2017

(30) Foreign Application Priority Data

Jun. 27, 2016 (JP) .................. 2016-126548

(51) Int. Cl.
| | |
|---|---|
| *H03H 9/02* | (2006.01) |
| *H03H 9/13* | (2006.01) |
| *H03H 9/64* | (2006.01) |
| *H03H 9/70* | (2006.01) |
| *H01L 41/187* | (2006.01) |
| *H03H 9/54* | (2006.01) |
| *H03H 9/10* | (2006.01) |

(52) U.S. Cl.
CPC ......... *H03H 9/706* (2013.01); *H01L 41/1873* (2013.01); *H03H 9/02015* (2013.01); *H03H 9/02086* (2013.01); *H03H 9/02559* (2013.01); *H03H 9/02921* (2013.01); *H03H 9/02992* (2013.01); *H03H 9/1071* (2013.01); *H03H 9/13* (2013.01); *H03H 9/54* (2013.01)

(58) Field of Classification Search
CPC .. H03H 9/02; H03H 9/02086; H03H 9/02992; H03H 9/13; H03H 9/64
USPC ........................................... 333/193
See application file for complete search history.

(56) References Cited

U.S. PATENT DOCUMENTS

| | | | | |
|---|---|---|---|---|
| 3,736,045 A | * | 5/1973 | Heidrich | G02F 1/011 359/305 |
| 6,856,218 B2 | * | 2/2005 | Yamazaki | H03H 9/25 310/313 A |
| 8,269,200 B2 | * | 9/2012 | Wraback | G02F 2/004 250/504 R |
| 2007/0013458 A1 | | 1/2007 | Itou et al. | |

FOREIGN PATENT DOCUMENTS

| | | |
|---|---|---|
| JP | 2001-257555 A | 9/2001 |
| KR | 10-2007-0008456 A | 1/2007 |

* cited by examiner

*Primary Examiner* — Dean Takaoka
(74) *Attorney, Agent, or Firm* — Keating & Bennett, LLP (57) ABSTRACT

An elastic wave apparatus includes a piezoelectric substrate including a main surface and a polarization axis direction having a tilt angle with respect to the main surface, an IDT electrode provided on the main surface, and at least one line on the main surface and between an end edge of the main surface and the IDT electrode. A relationship $a \leq 316|\cos(\theta)|$ μm is satisfied where a denotes a distance from the end edge of the main surface to the IDT electrode and $b \geq 28$ μm where a dimension of the line along a direction connecting the end edge to the IDT electrode is defined as a width, b denotes the width of the line when one line is provided, and b denotes the sum of the widths of multiple lines when the multiple lines are provided.

20 Claims, 10 Drawing Sheets

ELASTIC WAVE APPARATUS

CROSS REFERENCE TO RELATED APPLICATIONS

This application claims the benefit of priority to Japanese Patent Application No. 2016-126548 filed on Jun. 27, 2016. The entire contents of this application are hereby incorporated herein by reference.

BACKGROUND OF THE INVENTION

1. Field of the Invention

The present invention relates to an elastic wave apparatus.

2. Description of the Related Art

Elastic wave apparatuses have been widely used in, for example, filters for cellular phones. For example, an elastic wave apparatus is disclosed in Japanese Unexamined Patent Application Publication No. 2001-257555, in which a discharge electrode is provided on a piezoelectric substrate so as to surround an interdigital transducer (IDT) electrode. The discharge electrode is not connected to the IDT electrode.

Electric charge may be generated on the surface of the piezoelectric substrate due to pyroelectric effect. An electric field is applied in a direction opposite to the direction of a polarization axis due to the electric charge generated on an end edge of the piezoelectric substrate. If the intensity of the electric field exceeds a threshold value (coercive electric field), polarization reversal occurs. The polarization reversal occurs from the end edge of the piezoelectric substrate and tends to progress toward the inner side of the piezoelectric substrate. Accordingly, arrangement of the IDT electrode at a position close to the end edge of the piezoelectric substrate may cause the polarization reversal to progress to a portion where the IDT electrode is provided to degrade impedance characteristics and so on.

In order to prevent the degradation of the impedance characteristics due to the polarization reversal, the IDT electrode may be arranged at a position spaced apart from the end edge of the piezoelectric substrate. However, it is difficult to reduce the elastic wave apparatus in size in this case.

In Japanese Unexamined Patent Application Publication No. 2001-257555, the discharge electrode is provided in order to reduce the impact of the pyroelectric effect. However, the discharge electrode is formed so as to surround the IDT electrode and the degree of freedom in layout of the electrode arrangement is reduced. Accordingly, it remains difficult to achieve both the reduction of the impact of the pyroelectric effect and the reduction of the elastic wave apparatus in size.

SUMMARY OF THE INVENTION

Accordingly, preferred embodiments of the present invention provide elastic wave apparatuses capable of reducing the impact of the pyroelectric effect and capable of reducing the size of the elastic wave apparatus.

According to a preferred embodiment of the present invention, an elastic wave apparatus includes a piezoelectric substrate that includes a main surface and that has a polarization axis direction having a tilt angle $\theta$ with respect to the main surface, an IDT electrode provided on the main surface of the piezoelectric substrate, and at least one line, or wiring that is provided on the main surface of the piezoelectric substrate and that is provided between an end edge of the main surface and the IDT electrode. In the elastic wave apparatus, $a \leq 316|\cos(\theta)|\mu m$ where a denotes the distance from the end edge of the main surface to the IDT electrode and $b \geq 28$ μm where the dimension of the line along a direction connecting the end edge to the IDT electrode is defined as a width, the width of the line is denoted by b when one line is provided, and the sum of the widths of multiple lines is denoted by b when the multiple lines are provided.

In an elastic wave apparatus according to a preferred embodiment of the present invention, the piezoelectric substrate is preferably made of $LiTaO_3$.

In an elastic wave apparatus according to a preferred embodiment of the present invention, the polarization axis direction preferably has the tilt angle with respect to the main surface of the piezoelectric substrate, which is about 30° or more and about 65° or less.

In an elastic wave apparatus according to a preferred embodiment of the present invention, an expression $a \leq 235$ μm may be satisfied where a denotes the distance from the end edge to the IDT electrode. In this case, it is possible to further reduce the elastic wave apparatus in size.

In an elastic wave apparatus according to a preferred embodiment of the present invention, the end edge of the piezoelectric substrate may extend in a direction intersecting with the polarization axis direction.

In an elastic wave apparatus according to a preferred embodiment of the present invention, the end edge of the piezoelectric substrate may extend in a direction perpendicular or substantially perpendicular to the polarization axis direction.

In an elastic wave apparatus according to a preferred embodiment of the present invention, the at least one line may be electrically connected to one of ground potential and the IDT electrode.

In an elastic wave apparatus according to a preferred embodiment of the present invention, the at least one line may not be electrically connected to the ground potential and the IDT electrode.

According to various preferred embodiments of the present invention, it is possible to provide elastic wave apparatuses with reduced size and capable of reducing the impact of the pyroelectric effect.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will herein be demonstrated by describing specific preferred embodiments of the present invention with reference to the attached drawings.

The preferred embodiments described in the specification are only examples and partial replacement or combination of components may be available between different preferred embodiments.

Figure 1:
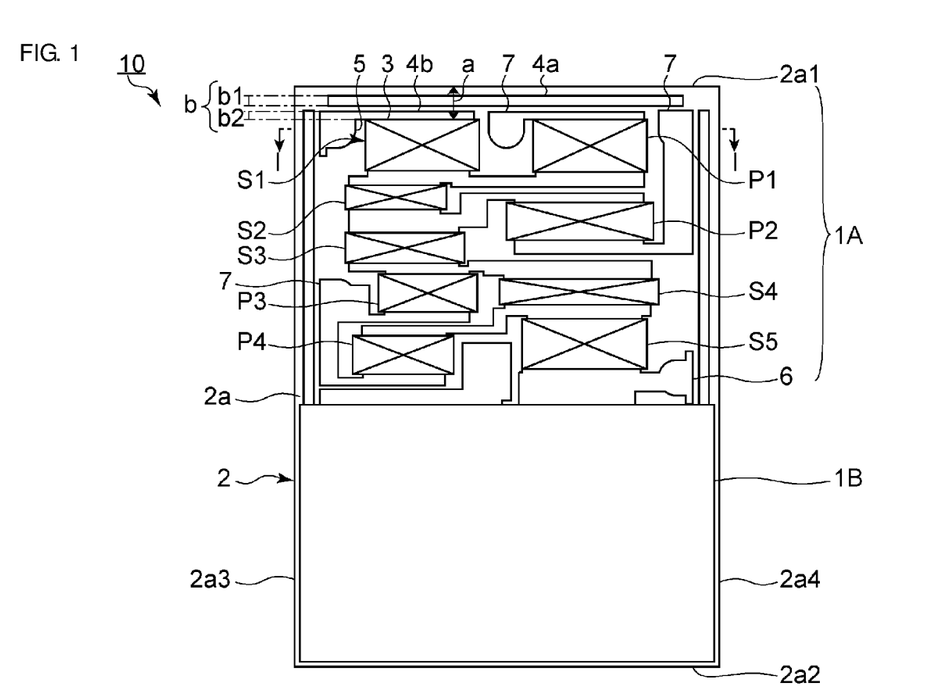
FIG. 1 is a schematic plan view illustrating an exemplary electrode structure of an elastic wave apparatus according to a first preferred embodiment of the present invention.
Figure 2:
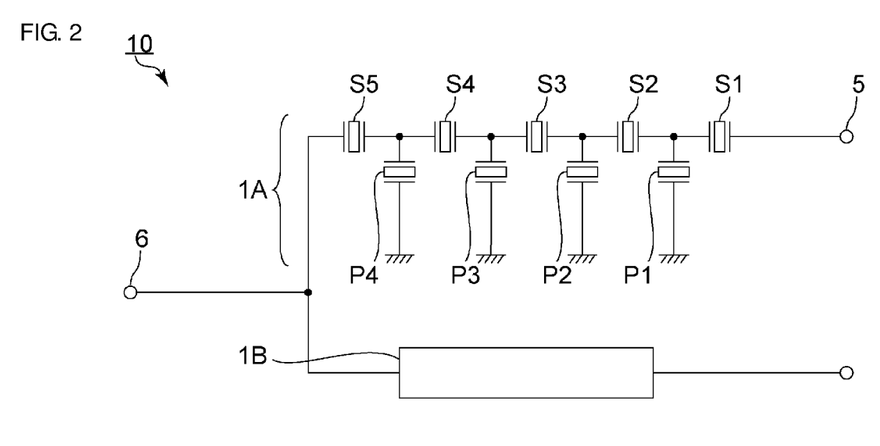
FIG. 2 is a schematic circuit diagram of the elastic wave apparatus according to the first preferred embodiment of the present invention.

FIG. 1 is a schematic plan view illustrating an exemplary electrode structure of an elastic wave apparatus according to a first preferred embodiment of the present invention. FIG. 2 is a schematic circuit diagram of the elastic wave apparatus according to the first preferred embodiment. Each elastic wave resonator described below is illustrated as a schematic diagram in which two diagonal lines are added to a rectangle in FIG. 1.

As illustrated in FIG. 1 and FIG. 2, in the first preferred embodiment, an elastic wave apparatus 10 preferably is a duplexer including first and second band pass filters 1A and 1B having different pass bands. The first and second band pass filters 1A and 1B are commonly connected to an antenna terminal 6 connected to an antenna. The configuration of the second band pass filter 1B is not specifically limited and is schematically illustrated as a block in FIG. 1 and FIG. 2.

As illustrated in FIG. 1, the elastic wave apparatus 10 includes a piezoelectric substrate 2. The piezoelectric substrate 2 preferably is made of $LiTaO_3$ that is Y-cut at about 42°. Although the cut angle of the piezoelectric substrate 2 is not specifically limited, the cut angle of the piezoelectric substrate 2 preferably has a value of about 30° or more and about 65° or less, for example. The piezoelectric substrate 2 may be made of a piezoelectric material, such as $LiNbO_3$, other than $LiTaO_3$.

The piezoelectric substrate 2 includes a first main surface 2a and a second main surface opposing the first main surface 2a. The first main surface 2a and the second main surface each preferably have a rectangular or substantially rectangular shape. The first main surface 2a includes a first end edge 2a1 and a second end edge 2a2 opposing the first end edge 2a1. The first main surface 2a also includes third and fourth end edges 2a3 and 2a4 with which the first end edge 2a1 is joined to the second end edge 2a2.

Figure 3:
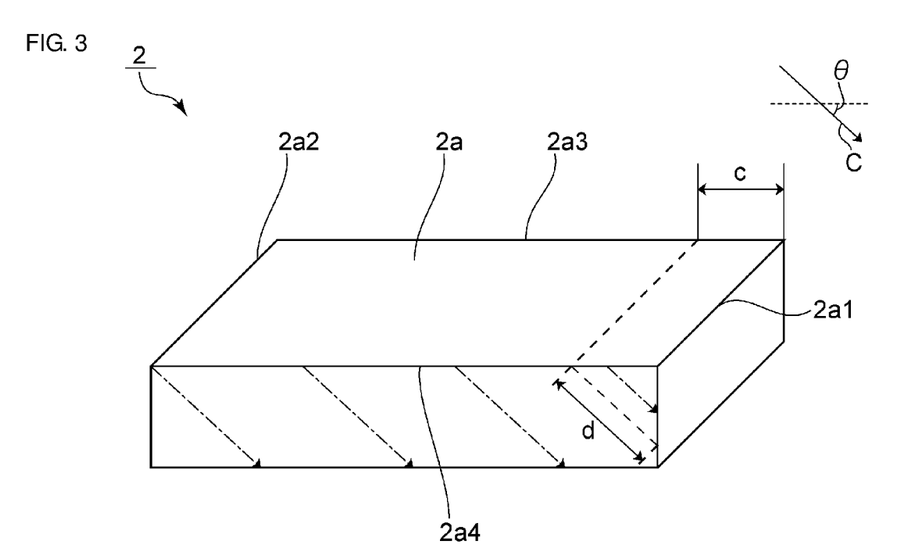
FIG. 3 is a schematic perspective view of a piezoelectric substrate in the first preferred embodiment of the present invention.

FIG. 3 is a schematic perspective view of the piezoelectric substrate in the first preferred embodiment. Referring to FIG. 3, each alternate long and short dash line arrow schematically illustrates a polarization axis of the piezoelectric substrate.

The piezoelectric substrate 2 has a polarization axis direction C a tilt angle of which with respect to the first main surface 2a is represented by θ°. In the first preferred embodiment, the tilt angle θ° in the polarization axis direction C preferably is equal to about 42° (θ°=42°), for example. Although the tilt angle θ° is not specifically limited, as in the cut angle of the piezoelectric substrate 2 described above, the tilt angle θ° is preferably equal to about 30° or more and about 65° or less, for example. The first end edge 2a1 and the second end edge 2a2 of the piezoelectric substrate 2 extend in a direction perpendicular or substantially perpendicular to the polarization axis direction C.

Referring back to FIG. 1, the first band pass filter 1A includes serial arm resonators S1 to S5 and parallel arm resonators P1 to P4, which are multiple elastic wave resonators. The serial arm resonator S1 includes an IDT electrode 3 provided on the first main surface 2a of the piezoelectric substrate 2. Each elastic wave resonator other than the serial arm resonator S1 also includes an IDT electrode. In each elastic wave resonator, reflectors are provided on both sides of the IDT electrode in an elastic wave propagation direction.

The IDT electrode 3 of the serial arm resonator S1 is arranged at a position closest to the first end edge 2a1 of the first main surface 2a, among the multiple IDT electrodes. First and second lines 4a and 4b are provided between the first end edge 2a1 and the IDT electrode 3. The first line 4a is connected to no IDT electrode and is not connected to ground potential. In other words, the first line 4a is a floating electrode. The second line 4b is connected to the IDT electrode 3.

Figure 4:
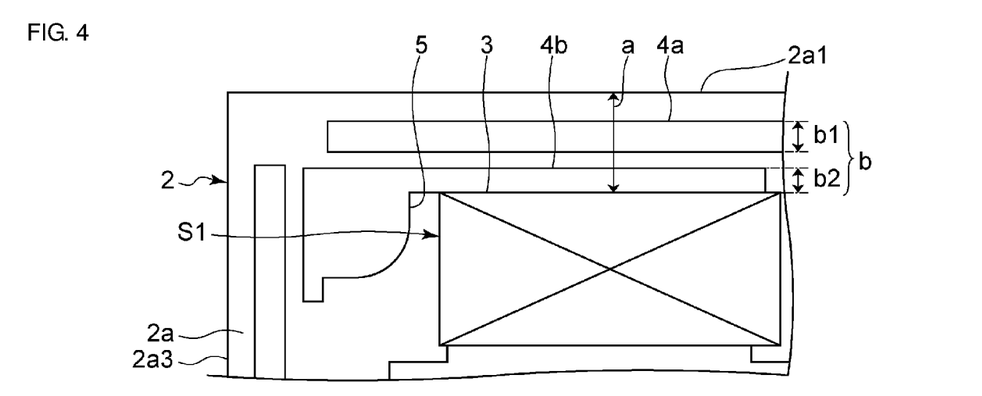
FIG. 4 is a schematic enlarged plan view near first and third end edges of the elastic wave apparatus according to the first preferred embodiment of the present invention.

FIG. 4 is a schematic enlarged plan view near the first and third end edges of the elastic wave apparatus according to the first preferred embodiment. Each elastic wave resonator is illustrated as a schematic diagram in which two diagonal lines are added to a rectangle in FIG. 4, as in FIG. 1. The same applies to FIG. 5 to FIG. 7 described below.

Referring to FIG. 4, the dimension of each of the first and second lines 4a and 4b along a direction connecting the first end edge 2a1 to the IDT electrode 3 is defined as a width. The width of the first line 4a is denoted by b1 and the width of the second line 4b is denoted by b2. The sum of the widths of the first and second lines 4a and 4b is denoted by b (b1+b2=b). In the first preferred embodiment, the sum b preferably is greater than or equal to about 28 μm (b≥28 μm), for example.

Figure 5:
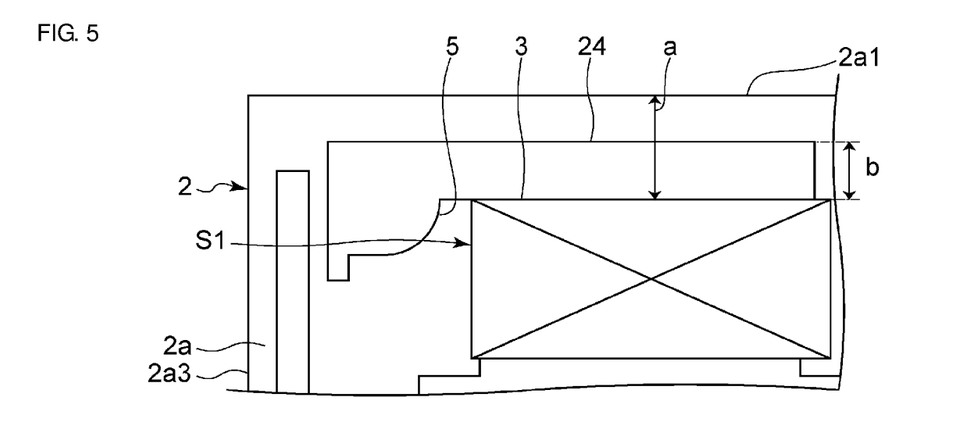
FIG. 5 is a schematic enlarged plan view near first and third end edges of an elastic wave apparatus according to a modification of the first preferred embodiment of the present invention.

As in a modification of the first preferred embodiment illustrated in FIG. 5, one line 24 may be provided between the IDT electrode 3 and the first end edge 2a1. In this case, it is sufficient for a width b of the line to be greater than or equal to about 28 μm (b≥28 μm) where the width of the line 24 is denoted by b, for example. It is sufficient for at least one line to be provided between the IDT electrode 3 and the first end edge 2a1 in the above manner. Although the line 24 is connected to the IDT electrode 3 in this modification, the line 24 may not be connected to the IDT electrode 3.

Referring back to FIG. 4, the distance from the first end edge 2a1 to the IDT electrode 3 is denoted by a. Here, a is represented by the following expression using the tilt angle θ° in the polarization axis direction C of the piezoelectric substrate 2 illustrated in FIG. 3:

$$a \leq 316 |\cos(\theta)| \mu m$$

This expression will be described in detail below. Since the tilt angle θ° preferably is equal to about 42° (θ°=42°) in the first preferred embodiment, a≤235 µm, for example.

Figure 6:
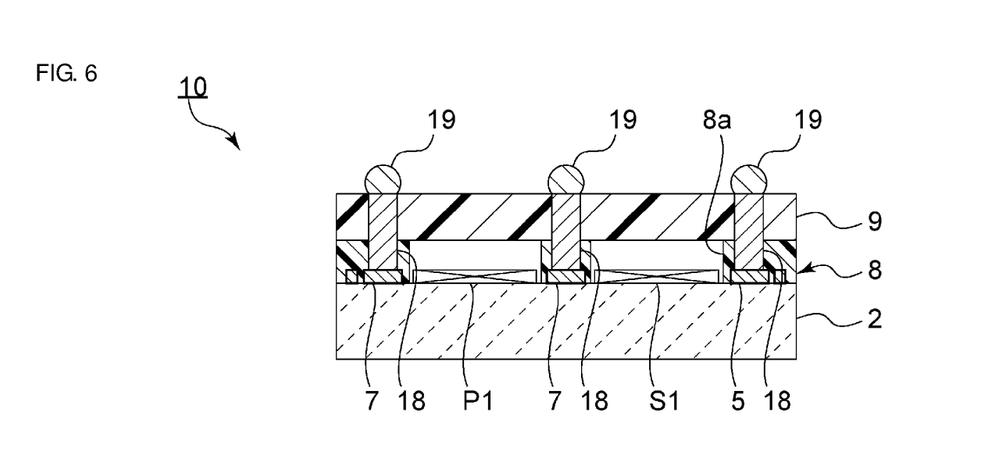
FIG. 6 is a schematic cross-sectional view of the elastic wave apparatus, taken along I-I line in FIG. 1.

FIG. 6 is a schematic cross-sectional view of the elastic wave apparatus, taken along I-I line in FIG. 1.

The elastic wave apparatus 10 preferably has a wafer level package (WLP) structure. More specifically, a support member 8 is provided on the piezoelectric substrate 2. The support member 8 has a cavity 8a surrounding the serial arm resonators S1 to S5 and the parallel arm resonators P1 to P4 illustrated in FIG. 1. A cover member 9 is provided on the support member 8 so that the cavity 8a is covered with the cover member 9.

Multiple via electrodes 18 are provided so as to pass through the cover member 9 and the support member 8. End portions of the respective via electrodes 18 at the piezoelectric substrate 2 side are connected to ground terminals 7 and an input terminal 5, which are provided on the piezoelectric substrate 2. The via electrode 18 is also connected to the antenna terminal described above. A bump 19 is joined to the end portion of each via electrode 18 at the cover member 9 side.

Figure 7:
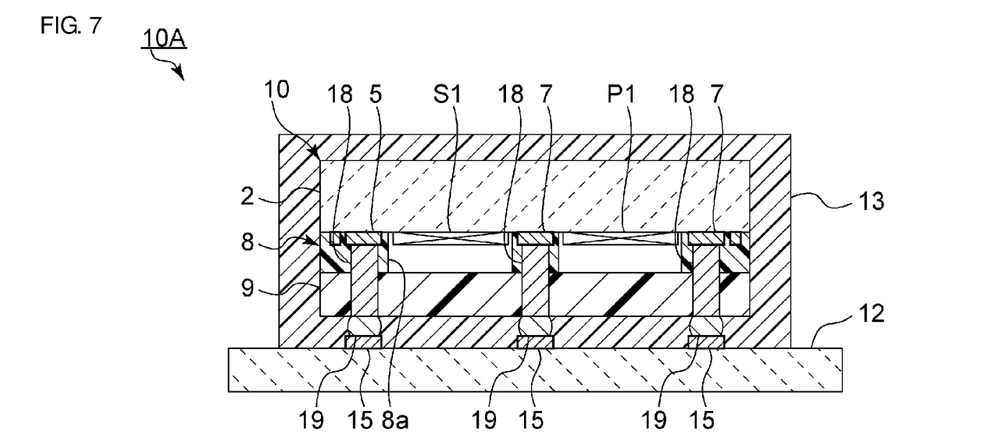
FIG. 7 is a schematic front cross-sectional view of an elastic wave apparatus mounting structure in which the elastic wave apparatus according to the first preferred embodiment of the present invention is mounted on a mounting board.

FIG. 7 is a schematic front cross-sectional view of an elastic wave apparatus mounting structure in which the elastic wave apparatus according to the first preferred embodiment is mounted on a mounting board.

In an elastic wave apparatus mounting structure 10A, the elastic wave apparatus 10 is mounted on a mounting board 12 with the bumps 19 interposed therebetween. More specifically, the bumps 19 are joined to electrode lands 15 provided on the mounting board 12. The first and second band pass filters are electrically connected to the outside with the terminals including the input terminal 5, the antenna terminal, and the ground terminals 7, the via electrodes 18, the bumps 19, and the electrode lands 15 interposed therebetween. Sealing resin 13 is provided on the mounting board 12 so that the elastic wave apparatus 10 is covered with the sealing resin 13.

The WLP structure in the elastic wave apparatus 10 is only an example. The elastic wave apparatus 10 may have, for example, a chip size package (CSP) structure other than the WLP structure.

Referring back to FIG. 1, the first preferred embodiment preferably includes at least one line provided between the first end edge 2a1 and the IDT electrode 3, b≥28 µm, and a≤316|cos(θ)|µm, for example. With this configuration, it is possible to reduce the impact of pyroelectric effect and to reduce the elastic wave apparatus 10 in size. This will be described below with the configuration of the first band pass filter 1A.

As illustrated in FIG. 2, the first band pass filter 1A includes the input terminal 5 described above. The serial arm resonators S1 to S5 are connected in series to each other between the input terminal 5 and the antenna terminal 6.

The parallel arm resonator P1 is connected between a node between the serial arm resonator S1 and the serial arm resonator S2 and the ground potential. The parallel arm resonator P2 is connected between a node between the serial arm resonator S2 and the serial arm resonator S3 and the ground potential. The parallel arm resonator P3 is connected between a node between the serial arm resonator S3 and the serial arm resonator S4 and the ground potential. The parallel arm resonator P4 is connected between a node between the serial arm resonator S4 and the serial arm resonator S5 and the ground potential.

The ground terminals 7 illustrated in FIG. 1 are connected to the ground potential illustrated in FIG. 2.

As described above, the electric field is applied in the direction opposite to the polarization axis direction C due to the electric charge which is caused by the pyroelectric effect and which is generated on the piezoelectric substrate 2 illustrated in FIG. 3. If the intensity of the electric field exceeds the coercive electric field, the polarization reversal occurs. The intensity of the electric field is increased as a length d is decreased where d denotes the length of the polarization axis. Since the length d is equal or substantially equal to zero at the first end edge 2a1, the electric field has the highest intensity at the first end edge 2a1. Accordingly, the polarization reversal occurs from the first end edge 2a1. On the first main surface 2a, the intensity of the electric field is increased and the polarization reversal is easy to occur as a distance c from the first end edge 2a1 is decreased.

The distance c from the first end edge 2a1 is represented by the following equation in a portion where d|sin(θ)| is smaller than the thickness of the piezoelectric substrate 2:

$$c=d|\cos(\theta)|$$

Figure 8:
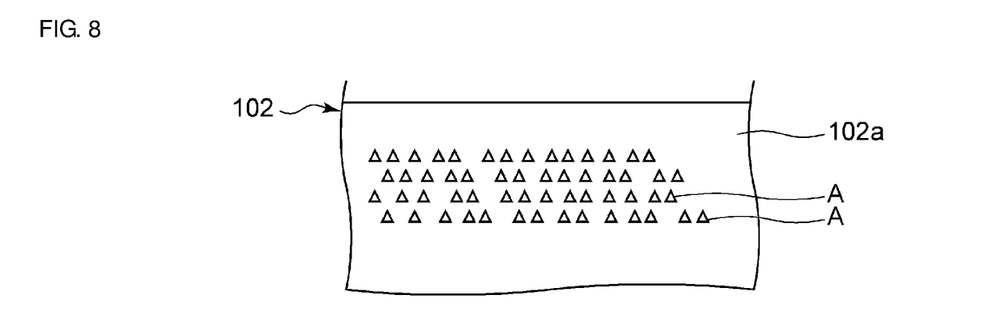
FIG. 8 is a schematic enlarged plan view illustrating an example of a portion where polarization reversal occurs on a piezoelectric substrate.

FIG. 8 is a schematic enlarged plan view illustrating an example of a portion where the polarization reversal occurs on a piezoelectric substrate 102. For example, multiple substantially triangle spots A occur in a portion where the polarization reversal occurs on a first main surface 102a of the piezoelectric substrate 102. The multiple spots A tends to occur in rows.

Here, the impact of the pyroelectric effect on a piezoelectric substrate which is Y-cut at about 42°, as in the piezoelectric substrate in the first preferred embodiment, and on which no electrode is provided was measured. More specifically, a cycle of a heating process and a cooling process was repeated about 100 times. In the heating process, the temperature of the piezoelectric substrate is increased from about −40° C. to about 125° C. In the cooling process, the temperature of the piezoelectric substrate is decreased from about 125° C. to about −40° C. Next, a polarization reversal progression distance, which is the distance by which the polarization reversal progresses from the first end edge, was measured on the first main surface of the piezoelectric substrate.

In addition, multiple elastic wave apparatus mounting structures in which the piezoelectric substrates are Y-cut at about 42° and which have the same configuration as the structure illustrated in FIG. 7 were manufactured. The multiple elastic wave apparatus mounting structures were manufactured so as to be different from each other in the sum b of the widths of the first and second lines. The value of the sum b was set to about 20 µm, about 30 µm, and about 50 µm, for example. Then, the cycle of the heating process and the cooling process was repeated about 100 times in the multiple elastic wave apparatus mounting structures and the polarization reversal progression distance was measured to find the relationship between the sum b of the widths of the first and second lines and the polarization reversal progression distance.

The result of the piezoelectric substrate in which no electrode is provided corresponds to the result when b=0. In addition to the case in which the cut angle of the piezoelectric substrate is about 42°, the polarization reversal progression distance in a case in which the cut angle of the piezoelectric substrate is about 30° and the polarization reversal progression distance in a case in which the cut angle of the piezoelectric substrate is about 65° are illustrated in FIG. 9, for example.

Figure 9:
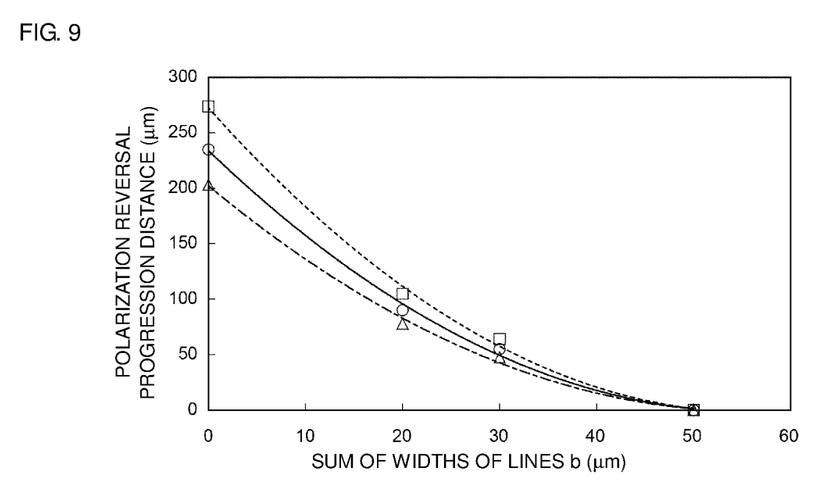
FIG. 9 is a graph illustrating the relationship between the sum of the widths of lines and a polarization reversal progression distance.

FIG. 9 is a graph illustrating the relationship between the sum b of the widths of the lines and the polarization reversal progression distance. Referring to FIG. 9, a solid line and circular plots indicate a result in the case in which the cut angle of the piezoelectric substrate is about 42°, a broken line and rectangular plots indicate a result in the case in which the cut angle of the piezoelectric substrate is about 30°, and an alternate long and short dash line and triangular plots indicate a result in the case in which the cut angle of the piezoelectric substrate is about 65°, for example.

As illustrated by the solid line in FIG. 9, in the case in which the cut angle of the piezoelectric substrate is about 42°, the polarization reversal progression distance is about 235 µm when b=0 where the first and second lines are not provided. This indicates that the provision of the first and second lines decreases the polarization reversal progression distance to a value lower than about 235 µm, for example. Since the electric field caused by the pyroelectric effect is dispersed with the first and second lines, the intensity of the electric field is decreased. Accordingly, the polarization reversal is difficult to occur.

Since the first and second lines are provided in the first preferred embodiment, the polarization reversal is difficult to occur in the portion where the IDT electrode is provided even when the distance a between the first end edge and the IDT electrode is set to a value lower than or equal to about 235 µm (a≤235 µm), for example. Accordingly, the impact of the pyroelectric effect is reduced and the IDT electrode comes close to the first end edge of the piezoelectric substrate. As a result, it is possible to reduce the size of the elastic wave apparatus.

When the first and second lines are not provided, the polarization reversal is easy to occur in a portion where the distance c from the first end edge $2a1$ illustrated in FIG. 3 is shorter than or equal to about 235 µm (c≤235 µm), for example. In other words, the polarization reversal is easy to occur in a portion where the length d of the polarization axis≤235/cos 42°=316 µm, for example.

The same tendency as in the result when the cut angle of the piezoelectric substrate is set to about 42°, which is illustrated with the solid line in FIG. 9, appears also when the cut angle of the piezoelectric substrate is set to a value other than about 42°, for example, as illustrated with the broken line and the alternate long and short dash line in FIG. 9. Accordingly, when the first and second lines are not provided, the polarization reversal is easy to occur in the portion where d≤316 µm even if the tilt angle θ° of the polarization axis direction C is set to a value other than about 42°, for example. Consequently, the polarization reversal is easy to occur when c=d|cos(θ)|≤316|cos(θ)|µm, for example.

In contrast, when the first and second lines are provided, as in the first preferred embodiment, the polarization reversal is difficult to occur also when c≤316|cos(θ)|µm, for example. Accordingly, the polarization reversal is difficult to occur in the portion where the IDT electrode is provided also when the distance a between the first end edge and the IDT electrode≤316|cos(θ)|µm, for example.

As illustrated with the solid line in FIG. 9, setting the distance a to a value greater than or equal to about $0.075b^2-8.4038b+233.85$ µm (a≥$0.075b^2-8.4038b+233.85$ µm), for example, the impact of the pyroelectric effect is reduced. For example, since b≥28 µm preferably is satisfied in the first preferred embodiment, the impact of the pyroelectric effect is effectively reduced when a≥57.3 µm, for example. Accordingly, it is preferred that a≥$0.075b^2-8.4038b+233.85$ µm and a≥b, for example.

It is more preferred that b≥50 µm, for example. As illustrated in FIG. 9, the polarization reversal progression distance is equal or substantially equal to zero when b≥50 µm.

The impact of the polarization reversal on impedance characteristics will now be more specifically described.

An elastic wave apparatus mounting structure in a comparative example was manufactured. In the comparative example, the sum b of the widths of the first and second lines was set to about 16 µm (b=16 µm) and the distance a between the first end edge and the IDT electrode was set to about 65 µm (a=65 µm). The number of pairs of electrode fingers of the IDT electrode was set to about 80 and the opposing length was set to about 20λ. Here, λ denotes a wavelength defined by the pitch of the electrode fingers of the IDT electrode. The impedance characteristics were measured when the heating process and the cooling process described above were not performed, when the heating process and the cooling process were repeated about 100 times, and when the heating process and the cooling process were repeated about 200 times.

Figure 10:
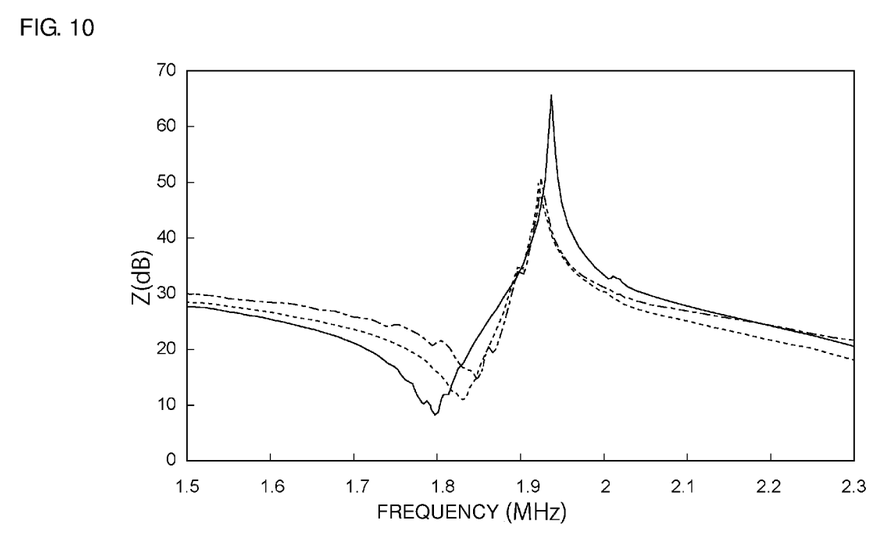
FIG. 10 is a graph illustrating impedance characteristics of an elastic wave apparatus of a comparative example.

FIG. 10 is a graph illustrating the impedance characteristics of an elastic wave apparatus of the comparative example. Referring to FIG. 10, a solid line indicates a result when the heating process and the cooling process were not performed, a broken line indicates a result when the heating process and the cooling process were repeated about 100 times, and an alternate long and short dash line indicates a result when the heating process and the cooling process were repeated about 200 times.

The result indicated by the solid line in FIG. 10 illustrates the impedance characteristics in a state in which the polarization reversal does not occur. The results indicated by the broken line and the alternate long and short dash line in FIG. 10 indicate that the impedance characteristics were degraded, compared with the result indicated by the solid line. The pyroelectric effect is caused through the heating process and the cooling process and the polarization reversal occurs. In the comparative example, the polarization reversal occurs in the portion where the IDT electrode is provided. Accordingly, the impedance characteristics are degraded, as illustrated in FIG. 10.

In the first preferred embodiment, since the polarization reversal is difficult to occur in the portion where the IDT electrode is provided, the degradation of the impedance characteristics is difficult to occur through the heating process and the cooling process.

In addition, the piezoelectric substrate is covered with the first and second lines in the first preferred embodiment. Accordingly, oxidation of the piezoelectric substrate is significantly reduced or prevented even when heat is applied to the piezoelectric substrate in the manufacturing process of the elastic wave apparatus. This improves conductivity and pyroelectric resistance of the piezoelectric substrate to keep an effect in which the electric charge generated near the first end edge is neutralized with the piezoelectric substrate itself. Accordingly, the impact of the pyroelectric effect is further reduced.

The first end edge $2a1$ illustrated in FIG. 3 is preferably perpendicular or substantially perpendicular to the polarization axis direction C, as in the first preferred embodiment. The impact of the pyroelectric effect is able to be reduced even when the first end edge $2a1$ is not perpendicular or substantially perpendicular to the polarization axis direction C. For example, the first end edge $2a1$ may obliquely intersect with the polarization axis direction C.

The IDT electrode 3 of the serial arm resonator S1 closest to the first end edge 2a1, illustrated in FIG. 1, is taken as an example in the above description. A line is preferably provided so that the sum b is greater than or equal to about 28 μm (b≥28 μm), for example, also between the IDT electrode of the parallel arm resonator P1, no IDT electrode is provided between which and the first end edge 2a1, as in the first preferred embodiment, and the first end edge 2a1. The provision of the line enables the impact of the pyroelectric effect to be reduced also in the parallel arm resonator P1.

In the first preferred embodiment, the first line 4a is a floating electrode and the second line 4b is electrically connected to the IDT electrode 3. The elastic wave apparatus 10 may include at least one line that is provided between the IDT electrode 3 and the first end edge 2a1 and that is connected to the ground potential. Since the electric charge caused by the pyroelectric effect is capable of being moved to the ground potential in this case, the impact of the pyroelectric effect is further reduced.

The IDT electrode 3 closest to the first end edge 2a1 may be, for example, an IDT electrode of a longitudinally coupled resonator-type elastic wave filter. It is possible to reduce the impact of the pyroelectric effect and to reduce the size of the elastic wave apparatus.

Although the elastic wave apparatus 10 preferably is a duplexer in the first preferred embodiment, the present invention is preferably applied to an elastic wave apparatus other than the duplexer, such as a band pass filter or a multiplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave apparatus comprising:
   a piezoelectric substrate including a main surface and a polarization axis direction having a tilt angle θ with respect to the main surface;
   an interdigital transducer electrode provided on the main surface of the piezoelectric substrate; and
   at least one line that is provided on the main surface of the piezoelectric substrate and that is provided between an end edge of the main surface and the interdigital transducer electrode; wherein
   a≤316|cos(θ)|μm where a denotes a distance from the end edge of the main surface to the interdigital transducer electrode; and
   b≥28 μm where a dimension of the line along a direction connecting the end edge to the interdigital transducer electrode is a width, the width of the at least one line is denoted by b when one line is provided, and a sum of the widths of a plurality of lines is denoted by b when the plurality of lines are provided.

2. The elastic wave apparatus according to claim 1, wherein the piezoelectric substrate is made of LiTaO$_3$.

3. The elastic wave apparatus according to claim 1, wherein the polarization axis direction has the tilt angle with respect to the main surface of the piezoelectric substrate, which is about 30° or more and about 65° or less.

4. The elastic wave apparatus according to claim 1, wherein a≤235 μm where a denotes a distance from the end edge to the interdigital transducer electrode.

5. The elastic wave apparatus according to claim 1, wherein the end edge of the piezoelectric substrate extends in a direction intersecting with the polarization axis direction.

6. The elastic wave apparatus according to claim 5, wherein the end edge of the piezoelectric substrate extends in a direction perpendicular or substantially perpendicular to the polarization axis direction.

7. The elastic wave apparatus according to claim 1, wherein the at least one line is electrically connected to one of ground potential and the interdigital transducer electrode.

8. The elastic wave apparatus according to claim 1, wherein the at least one line is not electrically connected to ground potential and the interdigital transducer electrode.

9. The elastic wave apparatus according to claim 1, wherein the elastic wave apparatus is a duplexer including first and second pass band filters with pass bands that are different from each other.

10. The elastic wave apparatus according to claim 1, wherein the piezoelectric substrate has a Y-cut at about 42°.

11. The elastic wave apparatus according to claim 1, wherein the piezoelectric substrate has a cut angle of about 30° or more and about 65° or less.

12. The elastic wave apparatus according to claim 9, wherein the first band pass filter includes serial arm resonators and parallel arm resonators.

13. The elastic wave apparatus according to claim 9, wherein the first band pass filter and the second band pass filter include reflectors.

14. The elastic wave apparatus according to claim 1, wherein the at least one line defines a floating electrode.

15. The elastic wave apparatus according to claim 1, wherein the at least one line includes a first line and a second line.

16. The elastic wave apparatus according to claim 1, wherein the elastic wave apparatus has one of a wafer level package structure and a chip size package structure.

17. The elastic wave apparatus according to claim 1, further comprising a support on the piezoelectric substrate including a cavity surrounding the interdigital transducer electrode and a cover that covers the cavity.

18. The elastic wave apparatus according to claim 1, wherein b≥50 μm.

19. The elastic wave apparatus according to claim 15, wherein the first line defines a floating electrode and the second line is electrically connected to the interdigital transducer electrode.

20. The elastic wave apparatus according to claim 1, wherein the elastic wave apparatus is one of a multiplexer and a band pass filter.